(12) United States Patent
Park et al.

(10) Patent No.: US 10,355,643 B2
(45) Date of Patent: Jul. 16, 2019

(54) DIFFERENTIAL COLPITTS VOLTAGE-CONTROLLED OSCILLATOR

(71) Applicant: Korea Advanced Institute of Science and Technology, Daejeon (KR)

(72) Inventors: Chul-Soon Park, Daejeon (KR); Dong-Min Kang, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 140 days.

(21) Appl. No.: 15/426,338

(22) Filed: Feb. 7, 2017

(65) Prior Publication Data

US 2018/0175796 A1  Jun. 21, 2018

(30) Foreign Application Priority Data

Dec. 15, 2016  (KR) .......................... 10-2016-0171339

(51) Int. Cl.
*H03B 5/12*  (2006.01)

(52) U.S. Cl.
CPC ......... *H03B 5/1243* (2013.01); *H03B 5/1212* (2013.01); *H03B 5/1228* (2013.01); *H03B 2200/0008* (2013.01); *H03B 2200/009* (2013.01)

(58) Field of Classification Search
CPC .......... H03B 5/1228; H03B 2200/0008; H03B 5/1243; H03B 5/1212; H03B 7/06

USPC ................................. 331/167, 177 V, 117 FE
See application file for complete search history.

(56) References Cited

U.S. PATENT DOCUMENTS

| | | | |
|---|---|---|---|
| 6,750,727 B1* | 6/2004 | Sutardja | H03B 5/1228 330/253 |
| 2014/0077890 A1* | 3/2014 | Babaie | H03B 1/00 331/117 R |

OTHER PUBLICATIONS

Andreani et al.: "A Study of Phase Noise in Colpitts and LC-Tank CMOS Oscillators"; IEEE Journal of Solid-State Circuits, vol. 40, No. 5, May 2005; pp. 1107-1118 (12 pages).

* cited by examiner

*Primary Examiner* — Arnold M Kinkead
(74) *Attorney, Agent, or Firm* — Daly, Crowley Mofford & Durkee, LLP (57) ABSTRACT

A differential Colpitts voltage-controlled oscillator according to example embodiments includes a feedback circuit constituting a Colpitts oscillator structure, a negative resistance circuit including a first negative resistance transistor and a second negative resistance transistor cross-coupled to each other and connected to the feedback circuit, a resonance circuit including a first inductor and a variable capacitor connected to both ends of the first inductor to generate differential output signals base on outputs of the feedback circuit, and a phase noise reduction circuit coupled to the feedback circuit to remove phase noise.

9 Claims, 4 Drawing Sheets

DIFFERENTIAL COLPITTS VOLTAGE-CONTROLLED OSCILLATOR

CROSS REFERENCE TO RELATED APPLICATION

This application claims priority to and the benefit of Korean Patent Application No. 10-2016-0171339, filed on Dec. 15, 2016 in the Korean Intellectual Property Office (KIPO), the disclosure of which is hereby incorporated by reference herein in its entirety.

BACKGROUND

1. Field

Example embodiments of the inventive concept relate to voltage oscillators. More particularly, example embodiments of the inventive concept relate to differential Colpitts voltage-controlled oscillators having transconductance amplification structure.

2. Discussion of Related Art

With the development of Complementary Metal-Oxide Semiconductor (CMOS) transistor process techniques, very high data transmission of tens of gigabits per second (Gbps) has become possible in wireless communications. In order to implement the wireless communication system employing such a high data rate and a higher-order modulation, a high-performance voltage-controlled oscillator with lower phase noise and lower power consumption that can be operated at high frequencies is essential.

A Colpitts oscillator is simple in structure and easy to implement the voltage-controlled oscillator. In addition, an effective impulse sensitivity function of the Colpitts oscillator is relatively better than LC cross-coupled oscillators such that phase noise performance of the Colpitts oscillator is better than the LC cross-coupled oscillators. However, oscillating start conditions of the Colpitts oscillator are not as good as the LC cross-coupled oscillator such that additional power consumption is required.

Figure 1:
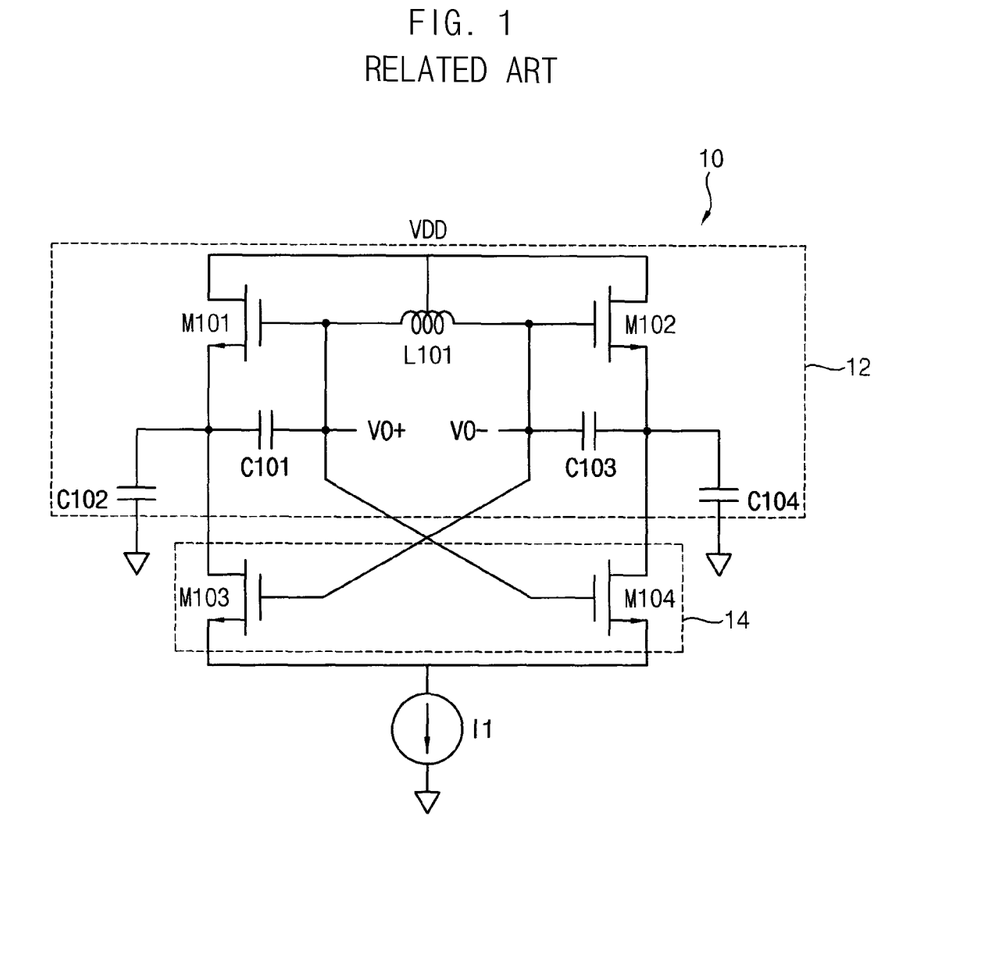
FIG. 1 is a circuit diagram illustrating an example of a differential Colpitts voltage-controlled oscillator having transconductance amplification structure in the related art.

FIG. 1 is a circuit diagram illustrating an example of a differential Colpitts voltage-controlled oscillator having transconductance amplification structure in the related art.

Referring to FIG. 1, the Colpitts voltage-controlled oscillator 10 has a conventional gate-source feedback Colpitts oscillator 12 and a pair of cross-coupled transistors 14 connected to the Colpitts oscillator 12. The pair of cross-coupled transistors 14 added to the gate-source feedback Colpitts oscillator 12 provides an extra negative resistance to a resonance circuit (e.g., a tank circuit), and thus a steady-state oscillation amplitude is improved at the same DC bias current compared with the conventional gate-source feedback Colpitts oscillator 12. As the CMOS process techniques develop, a supply voltage VDD applied to the gate-source feedback Colpitts oscillator 12 can be lowered. It is difficult to limit an operation region of switching transistors M101 and M102 included in the gate-source feedback oscillator 12 to a saturation region due to the low supply voltage VDD when the desired oscillation frequency is high. To solve this, Class-C operation oscillators with removed current source I1 have been developed for higher operation frequencies. Thus, it is required that low-power differential oscillator design techniques having improved phase noise performance with C-class operation suitable for deep-sub-micron CMOS process at the high operation frequencies.

SUMMARY

Example embodiments provide a differential Colpitts voltage-controlled oscillator including a phase noise reduction feedback circuit connected to drain nodes and source nodes of switching transistors included in a Colpitts oscillator structure.

According to example embodiments, a differential Colpitts voltage-controlled oscillator may comprise a feedback circuit constituting a Colpitts oscillator structure, a negative resistance circuit including a first negative resistance transistor and a second negative resistance transistor cross-coupled to each other and connected to the feedback circuit, a resonance circuit including a first inductor and a variable capacitor connected to both ends of the first inductor to generate differential output signals base on outputs of the feedback circuit, and a phase noise reduction circuit coupled to the feedback circuit to remove phase noise.

In example embodiments, the feedback circuit may comprise a pair of first and second switching transistors, a first capacitor connected between a gate node of the first switching transistor and a source node of the first switching transistor, a second capacitor connected between the source node of the first switching transistor and a ground, a third capacitor connected between a gate node of the second switching transistor and a source node of the second switching transistor, and a fourth capacitor connected between the source node of the second switching transistor and the ground. The gate node of the first switching transistor may be connected to a first end of the both ends of the first inductor and the gate node of the second switching transistor may be connected to a second end of the both ends of the first inductor.

In example embodiments, the first negative resistance transistor may include a drain node connected to the source node of the first switching transistor and a gate node connected to the gate node of the second switching transistor.

In example embodiments, the second negative resistance transistor may include a drain node connected to the source node of the second switching transistor and a gate node connected to the gate node of the first switching transistor.

In example embodiments, the phase noise reduction circuit may comprise a first phase noise reduction circuit including a fifth capacitor connected between a drain node of the first switching transistor and the source node of the first switching transistor, a sixth capacitor connected between the drain node of the first switching transistor and a supply voltage node, and a second inductor connected in parallel with the sixth capacitor, and a second phase noise reduction circuit including a seventh capacitor connected between a drain node of the second switching transistor and the source node of the second switching transistor, an eighth capacitor connected between the drain node of the second switching transistor and the supply voltage node, and a third inductor connected in parallel with the eighth capacitor.

In example embodiments, the phase noise reduction circuit may be configured to limit an on-state operation region of the first and second switching transistors to a linear region.

In example embodiments, the variable capacitor may change a conductance. A capacitance of the variable capacitor may be varied based on an adjustable voltage applied to a one end of the variable capacitor. A frequency of the differential output signals may change based on a variation of the capacitance of the variable capacitor.

Therefore, the differential Colpitts voltage-controlled oscillator according to example embodiments may include the first and second phase noise reduction circuits respectively connected between the drain nodes and source nodes of the first and second switching transistors to provide the feedback signals to the drain nodes of the first and second switching transistors, so that power consumption of the differential Colpitts voltage-controlled oscillator may be reduced. Thus, characteristics of the effective impulse sensitivity function of the differential Colpitts voltage-controlled oscillator and the phase noise cancellation performance may be improved.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Exemplary embodiments will be described more fully hereinafter with reference to the accompanying drawings, in which various embodiments are shown.

Figure 2:
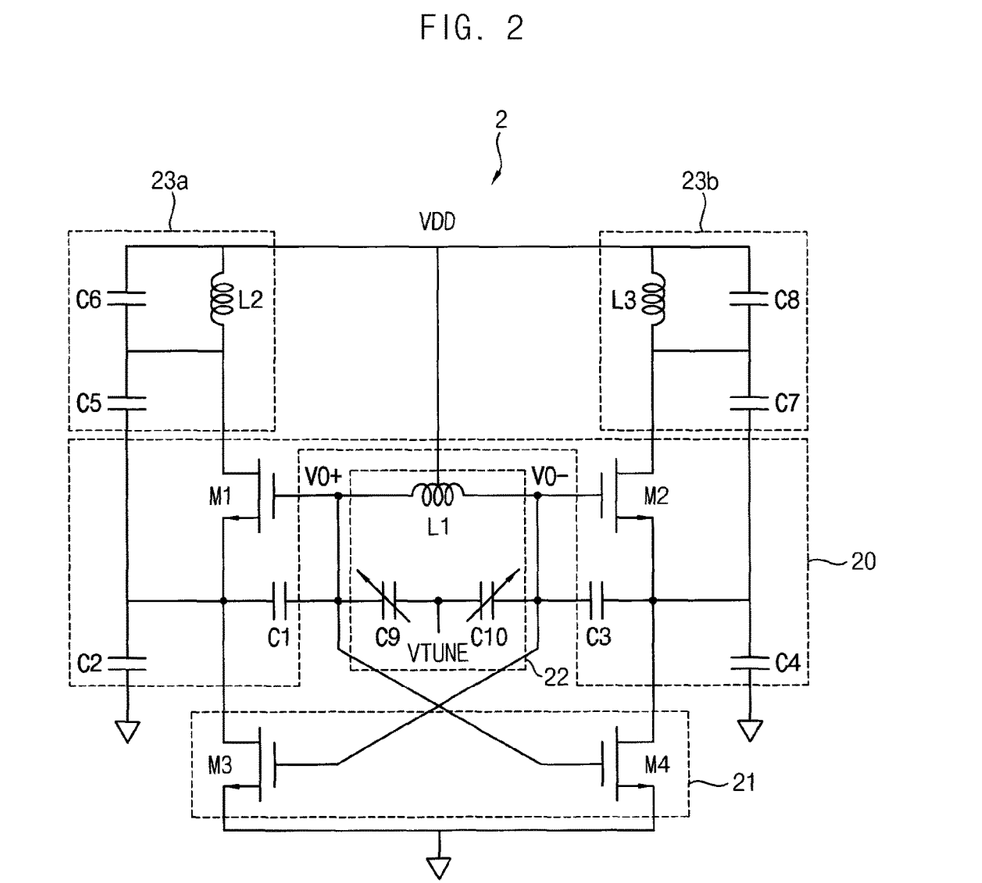
FIG. 2 is a circuit diagram of a differential Colpitts voltage-controlled oscillator according to example embodiments.
Figure 3A:
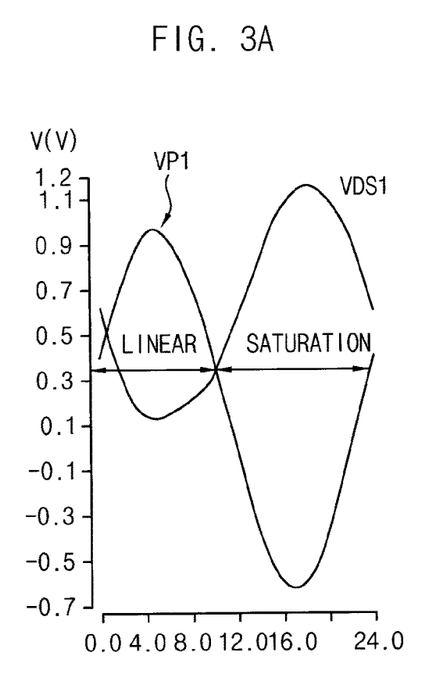
FIGS. 3A and 3B are timing diagrams illustrating examples of which operation regions of first and second switching transistors are limited by a phase noise reduction circuit included in the differential Colpitts voltage-controlled oscillator of FIG. 2.
Figure 3B:
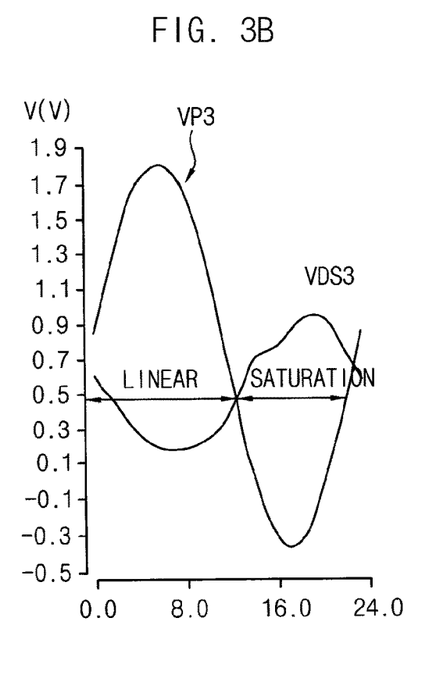

FIG. 2 is a circuit diagram of a differential Colpitts voltage-controlled oscillator according to example embodiments. FIGS. 3A and 3B are timing diagrams illustrating examples of which operation regions of first and second switching transistors are limited by a phase noise reduction circuit included in the differential Colpitts voltage-controlled oscillator of FIG. 2.

Referring to FIGS. 2 to 3B, the differential Colpitts voltage-controlled oscillator 2 may include a feedback circuit 20 constituting a Colpitts oscillator structure, a negative resistance circuit 21, a resonance circuit 22 (e.g., a tank circuit) including a first inductor L1 and a pair of variable capacitors C9 and C10 that are connected in parallel with the first inductor L1, and a phase noise reduction circuit 23a and 23b.

The feedback circuit 20 may include a pair of first and second switching transistors M1 and M2. The feedback circuit 20 may further include first through fourth capacitors C1 through C4. The first capacitor C1 may be connected between a gate node of the first switching transistor M1 and a source node of the first switching transistor M1 and the third capacitor C3 may be connected between a gate node of the second switching transistor M2 and a source node of the second switching transistor M2. The second capacitor C3 may be connected between the source node of the first switching transistor M1 and a ground and the fourth capacitor C4 may be connected between the source node of the second switching transistor M2 and a ground. The connection structure of the first and second transistors M1 and M2 and the first through fourth capacitors C1 through C4 may implement the Colpitts oscillator structure. The feedback circuit 20 may be coupled to the negative resistance circuit 21, the resonance circuit 22, and the phase noise reduction circuit 23a and 23b to implement the differential Colpitts voltage-controlled oscillator 2 having a transconductance amplification structure. Here, differential output signals V0+ and V0− of the differential Colpitts voltage-controlled oscillator 2 may be voltages at the gate nodes of the first and second switching transistors M1 and M2, respectively.

The negative resistance circuit 21 may be coupled to the feedback circuit 20. The negative resistance circuit 21 may be coupled to the source nodes and gate nodes of the first and second switching transistors M1 and M2. The negative resistance circuit 21 may include a pair of negative resistance transistors M3 and M4. In some embodiments, a first negative resistance transistor M3 may include a drain node connected to the source node of the first switching transistor M1, a source node connected to the ground, and a gate node connected to the gate node of the second switching transistor M2. Similarly, the second negative resistance transistor M4 may include a drain node connected to the source node of the second switching transistor M2, a source node connected to the ground, and a gate node connected to the gate node of the first switching transistor M1.

The resonance circuit 22 may include a first inductor L1 and a pair of variable capacitors C9 and C10 connected to both ends of the first inductor L1 to the generate differential output signals V0+ and V0− based on outputs of the feedback circuit 20. The first inductor L1 may be a center tapped inductor. A center tap node may be connected to a node to which a supply voltage VDD is applied (hereinafter, a supply voltage node). A first node of remaining nodes of the first inductor L1 may be connected to the gate node of the first switching transistor M1 of the feedback circuit 20 and a second node opposite to the first node of the first inductor L1 may be connected to the gate node of the second switching transistor M2 of the feedback circuit 20. The variable capacitors C9 and C10 may be connected in parallel with the first inductor L1. On end of a first variable capacitor C9 may be connected to the gate node of the first switching transistor M1 and the other end of the first variable capacitor C9 may be connected to a node to which an adjustable voltage VTUNE is applied (hereinafter, an adjustable voltage node). Similarly, a second variable capacitor C10 may be connected to the gate node of the second switching transistor M2 and the other end of the second variable capacitor C10 may be connected to the adjustable voltage node. Capacitances of the variable capacitors C9 and C10 may be varied based on the adjustable voltage VTUNE to change frequencies of the differential output signals V0+ and V0−.

The phase noise reduction circuit 23a and 23b may be coupled to the source nodes and the drain nodes of the first and second switching transistors M1 and M2 included in the feedback circuit 20. The phase noise reduction circuit 23a and 23b may include a first phase noise reduction circuit 23a and a second phase noise reduction circuit 23b. The first phase noise reduction circuit 23a may include a fifth capacitor C5 connected between the drain node of the first switching transistor M1 and the source node of the first switching transistor M1, a sixth capacitor C6 connected between the drain node of the first switching transistor M1 and the supply voltage node, and a second inductor L2 connected in parallel with the sixth capacitor C6. The second phase noise reduction circuit 23b may include a seventh capacitor C7 connected between the drain node of the second switching transistor M2 and the source node of the second switching transistor M2, an eighth capacitor C8 connected between the drain node of the second switching transistor M2 and the supply voltage node, and a third inductor L3 connected in parallel with the eighth capacitor C8.

In some embodiments, the first and second phase noise reduction circuits 23a and 23b may influence negative resistances of the differential Colpitts voltage-controlled oscillator 2. One of the negative resistance expect for the variable capacitors C9 and C10 related to one of the differential output signals V0+ and V0 of the differential Colpitts voltage-controlled oscillator 2 may be expressed by Equation 1.

$$\text{Re}[Z_x] = -2 \cdot \frac{\left(1 + \frac{1}{Z_L} \cdot \frac{C_5}{C_2}\right)}{Z_L} g_{m1} + \frac{\left(C_1 + C_2 + \frac{C_5}{Z_L}\right)}{C_2} g_{m3}}{w^2 C_1 C_2 \left(1 + \frac{1}{Z_L} \cdot \frac{C_5}{C_2}\right)^2 + g_{m3}^2 \frac{C_1}{C_2}} \quad \text{Equation 1}$$

In Equation 1, gm1 represents a transconductance of the first switching transistor M1, gm3 represents a transconductance of the first negative resistance transistor M3, ZL represents a load impedance of the first phase noise reduction circuit 23a. C1, C2, C5, C6, and L2 represent capacitances and inductance of the capacitors and inductor to output one of the differential output signals V0+ and V0 (e.g., the differential output signal V0+). Here, the load impedance may be $$Z_L = j\omega L_2 + \frac{1}{j\omega C_6}.$$

ω is a frequency component as an angular velocity and represented as ω=2πf.

In some embodiments, the phase noise reduction circuit 23a and 23b may limit an on-state operation region of the first and second switching transistors M1 and M2 to a linear region. A signal of the source node of the first switching transistor M1 may be transmitted to the drain node of the first switching transistor M1 by the fifth capacitor C5 of the first phase noise reduction circuit 23a and the load impedance by the sixth capacitor C6 and the second inductor L2 may generate a feedback signal.

Accordingly, as illustrated in FIGS. 3A and 3B, the on-stage operation region of the first switching transistor M1 may be substantially the same as the linear region. In FIG. 3A, VP1 represents an effective voltage for operation of the first switching transistor M1 (i.e., a voltage difference between a gate-source voltage and a threshold voltage of the first switching transistor M1) and VDS1 represents a drain-source voltage of the first switching transistor M1. In FIG. 3B, VP3 represents an effective voltage for operation of the first negative resistance transistor M3 (i.e., a voltage difference between a gate-source voltage and a threshold voltage of the first negative resistance transistor M3) and VDS3 represents a drain-source voltage of the first negative resistance transistor M3. Effective voltages and drain-source voltage of the second switching transistor M2 and the second negative resistance transistor M4 may be output having wave forms opposite to the waveforms of FIGS. 3A and 3B.

Accordingly, the differential Colpitts voltage-controlled oscillator 2 according to example embodiments may include the first and second phase noise reduction circuits 23a and 23b respectively connected between the drain nodes and source nodes of the first and second switching transistors M1 and M2 to provide the feedback signals to the drain nodes of the first and second switching transistors M1 and M2, so that power consumption of the differential Colpitts voltage-controlled oscillator 2 may be reduced. Thus, the effective impulse sensitivity function of the differential Colpitts voltage-controlled oscillator 2 and the phase noise cancellation performance may be improved.

In some embodiments, the transistors in the differential Colpitts voltage-controlled oscillator 2 may be n-channel metal-oxide semiconductor (NMOS) transistors. Since this is an example, some transistors can be replaced with p-channel metal-oxide semiconductor (PMOS) transistors.

The small signal current and noise calculation equations for the long channel complementary MOS (CMOS) process techniques are described in a paper "A Study of Phase Noise in Colpitts and LC-Tank CMOS Oscillators" published in "IEEE Journal of Solid-State Circuits (Vol. 40, No. 5, May 2005)". In some embodiments, the noise (e.g., the phase noise) of the differential Colpitts voltage-controlled oscillator 2 also can be analyzed using the equations of the paper when the differential Colpitts voltage-controlled oscillator 2 includes the long channel CMOS transistors.

When a channel length of the CMOS transistors less than 100 nm (i.e., a short channel CMOS transistor) is applied to the differential Colpitts voltage-controlled oscillator 2, the noise may be analyzed by the small signal current and noise calculation equations, also. The effective impulse sensitivity function may be derived based on the superposition principle of the circuit.

Figure 4:
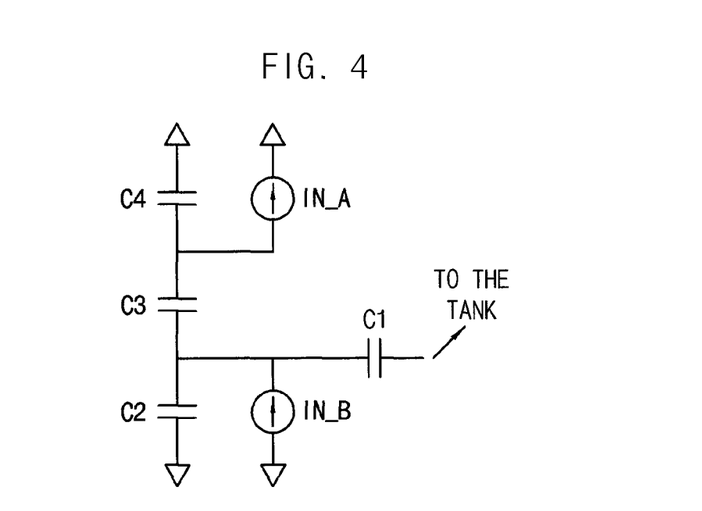
FIG. 4 is a circuit diagram for explaining an example of an effective impulse sensitivity function characteristics of the differential Colpitts voltage-controlled oscillator of FIG. 2.

FIG. 4 is a circuit diagram for explaining an example of an effective impulse sensitivity function characteristics of the differential Colpitts voltage-controlled oscillator of FIG. 2.

Referring to FIGS. 2 and 4, an equivalent circuit and an effective impulse sensitivity function of the differential Colpitts voltage-controlled oscillator 2 may be derived by the superposition principle. A drain thermal noise generated by the first switching transistor M1 may be calculated by a sum of a thermal noise source IN_A provided to the drain node of the first switching transistor M1 and a thermal noise source IN_B provided to the source node of the first switching transistor M2. Accordingly, when a total drain thermal noise generated by the first switching transistor M1 is $$\frac{\sin\phi_1}{2},$$

an impulse sensitivity function such as following Equation 2 may be derived.

$$\Gamma_1(\phi_1) = \left(\frac{C_1}{C_1 + C_2 + C_5 \| C_6}\right)\left(\frac{C_6}{C_5 + C_6}\right) \cdot \frac{\sin\phi_1}{2} \quad \text{Equation 2}$$

Here, C1, C2, C5, and C6 represent capacitances of the first, second, fifth, and sixth capacitors, respectively.

$$\frac{\sin\phi_1}{2}$$

represents the total drain thermal noise. Finally, the effective impulse sensitivity may be derived by determining an operation region of the first switching transistor M1.

The first phase noise reduction circuit 23*a* (i.e., the fifth and sixth capacitors C5 and C6) may reduce output value of the impulse sensitivity function as in Equation 2. An improvement of the noise may be verified by following Equation 3 of the effective impulse sensitivity function.

$$\Gamma_{\text{eff},1}^2 = \frac{1}{2\pi}\left(\frac{C_1}{C_1 + C_2 + C_5 \| C_6}\right)^2 \left(\frac{C_6}{C_5 + C_6}\right)^2 \cdot \frac{2}{15}\Phi_1^5\left(1 - \frac{11}{42}\Phi_1^2\right) \quad \text{Equation 3}$$

Here, C1, C2, C5, and C6 represent capacitances of the first, second, fifth, and sixth capacitors, respectively. $\Phi_1$ represents a conduction angle of the first switching transistor M1. The conduction angle may be determined based on the supply voltage VDD and a bias of the first switching transistor M1. The conduction angle may be a variable for determining a noise modulation function. A result value of the effective impulse sensitivity function may be reduced by $$\left(\frac{C_6}{C_5 + C_6}\right)^2$$

by the first phase noise reduction circuit 23*a* than that of the differential Colpitts oscillator in the related art.

Figure 5:
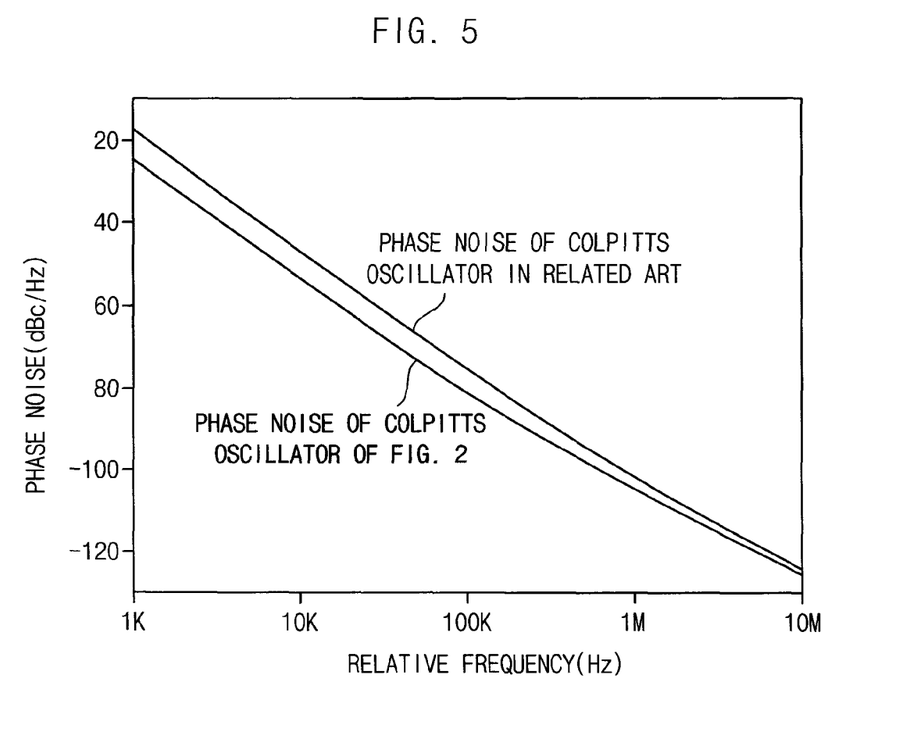
FIG. 5 is a graph for explaining an example of a phase noise characteristics of the differential Colpitts voltage-controlled oscillator of FIG. 2.

FIG. 5 is a graph for explaining an example of a phase noise characteristics of the differential Colpitts voltage-controlled oscillator of FIG. 2.

Referring to FIG. 5, the differential Colpitts voltage-controlled oscillator 2 may be designed with about 40 nm CMOS process. FIG. 5 shows a comparative example of phase noise of the differential Colpitts voltage-controlled oscillator 2 and phase noise of Colpitts oscillator in the relative art.

In a similar level of power consumption and voltage regulation range, the differential Colpitts voltage-controlled oscillator 2 may have about 2.5 dB noise reduction performance improvement compared with the existing Colpitts oscillator.

The differential Colpitts voltage-controlled oscillator 2 according to example embodiments may have a frequency adjustment range about 1.67 GHz from about 40.2 GHz to about 41.9 GHz and have phase noise performance of about −103.27 dBc/Hz at 1 MHz offset as illustrated in FIG. 5. The differential Colpitts voltage-controlled oscillator 2 may consume about 12.16 mW at a supply voltage VDD of about 1.2V and figure of merit (FoM) of the differential Colpitts voltage-controlled oscillator 2 may be −185.6 dBc/Hz/mW. Thus, as illustrated in FIG. 5, characteristics of the effective impulse sensitivity function of the differential Colpitts voltage-controlled oscillator 2 may be improved and thus the phase noise cancellation performance may be improved.

The present embodiments may be applied to any oscillators and various wired/wireless communication systems including the same.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A differential Colpitts voltage-controlled oscillator, comprising:
    a feedback circuit constituting a Colpitts oscillator structure;
    a negative resistance circuit including a first negative resistance transistor and a second negative resistance transistor cross-coupled to each other and connected to the feedback circuit;
    a resonance circuit including a first inductor and a variable capacitor connected to both ends of the first inductor to generate differential output signals base on outputs of the feedback circuit; and
    a phase noise reduction circuit coupled to the feedback circuit to remove phase noise,
    wherein the feedback circuit comprises:
    a pair of first and second switching transistors;
    a first capacitor connected between a gate node of the first switching transistor and a source node of the first switching transistor;
    a second capacitor connected between the source node of the first switching transistor and a ground;
    a third capacitor connected between a gate node of the second switching transistor and a source node of the second switching transistor; and
    a fourth capacitor connected between the source node of the second switching transistor and the ground, and
    wherein the gate node of the first switching transistor is connected to a first end of the both ends of the first inductor and the gate node of the second switching transistor is connected to a second end of the both ends of the first inductor, and
    wherein the phase noise reduction circuit is configured to limit an on-state operation region of the first and second switching transistors to a linear region.

2. The oscillator of claim 1, wherein the first negative resistance transistor includes a drain node connected to the source node of the first switching transistor and a gate node connected to the gate node of the second switching transistor, and
    wherein the second negative resistance transistor includes a drain node connected to the source node of the second switching transistor and a gate node connected to the gate node of the first switching transistor.

3. The oscillator of claim 1, wherein the phase noise reduction circuit comprises:
    a first phase noise reduction circuit including a fifth capacitor connected between a drain node of the first switching transistor and the source node of the first switching transistor, a sixth capacitor connected between the drain node of the first switching transistor and a supply voltage node, and a second inductor connected in parallel with the sixth capacitor; and a second phase noise reduction circuit including a seventh capacitor connected between a drain node of the second switching transistor and the source node of the second switching transistor, an eighth capacitor connected between the drain node of the second switching transistor and the supply voltage node, and a third inductor connected in parallel with the eighth capacitor.

4. The oscillator of claim 1, wherein the variable capacitor changes a conductance, wherein a capacitance of the variable capacitor is varied based on an adjustable voltage applied to a one end of the variable capacitor, and wherein a frequency of the differential output signals changes based on a variation of the capacitance of the variable capacitor.

5. A differential Colpitts voltage-controlled oscillator, comprising:

a feedback circuit constituting a Colpitts oscillator structure;

a negative resistance circuit including a first negative resistance transistor and a second negative resistance transistor cross-coupled to each other and connected to the feedback circuit;

a resonance circuit including a first inductor and a variable capacitor connected to both ends of the first inductor to generate differential output signals base on outputs of the feedback circuit; and a phase noise reduction circuit coupled to the feedback circuit to remove phase noise, wherein the feedback circuit comprises:

a pair of first and second switching transistors;

a first capacitor connected between a gate node of the first switching transistor and a source node of the first switching transistor;

a second capacitor connected between the source node of the first switching transistor and a ground;

a third capacitor connected between a gate node of the second switching transistor and a source node of the second switching transistor; and a fourth capacitor connected between the source node of the second switching transistor and the ground, and wherein the gate node of the first switching transistor is connected to a first end of the both ends of the first inductor and the gate node of the second switching transistor is connected to a second end of the both ends of the first inductor, and wherein the first negative resistance transistor includes a drain node connected to the source node of the first switching transistor and a gate node connected to the gate node of the second switching transistor, and wherein the second negative resistance transistor includes a drain node connected to the source node of the second switching transistor and a gate node connected to the gate node of the first switching transistor.

6. The oscillator of claim 5, wherein the phase noise reduction circuit comprises:

a first phase noise reduction circuit including a fifth capacitor connected between a drain node of the first switching transistor and the source node of the first switching transistor, a sixth capacitor connected between the drain node of the first switching transistor and a supply voltage node, and a second inductor connected in parallel with the sixth capacitor; and a second phase noise reduction circuit including a seventh capacitor connected between a drain node of the second switching transistor and the source node of the second switching transistor, an eighth capacitor connected between the drain node of the second switching transistor and the supply voltage node, and a third inductor connected in parallel with the eighth capacitor.

7. The oscillator of claim 5, wherein the variable capacitor changes a conductance, wherein a capacitance of the variable capacitor is varied based on an adjustable voltage applied to a one end of the variable capacitor, and wherein a frequency of the differential output signals changes based on a variation of the capacitance of the variable capacitor.

8. A differential Colpitts voltage-controlled oscillator, comprising:

a feedback circuit constituting a Colpitts oscillator structure;

a negative resistance circuit including a first negative resistance transistor and a second negative resistance transistor cross-coupled to each other and connected to the feedback circuit;

a resonance circuit including a first inductor and a variable capacitor connected to both ends of the first inductor to generate differential output signals base on outputs of the feedback circuit; and a phase noise reduction circuit coupled to the feedback circuit to remove phase noise, wherein the feedback circuit comprises:

a pair of first and second switching transistors;

a first capacitor connected between a gate node of the first switching transistor and a source node of the first switching transistor;

a second capacitor connected between the source node of the first switching transistor and a ground;

a third capacitor connected between a gate node of the second switching transistor and a source node of the second switching transistor; and a fourth capacitor connected between the source node of the second switching transistor and the ground, and wherein the gate node of the first switching transistor is connected to a first end of the both ends of the first inductor and the gate node of the second switching transistor is connected to a second end of the both ends of the first inductor, and wherein the phase noise reduction circuit comprises:

a first phase noise reduction circuit including a fifth capacitor connected between a drain node of the first switching transistor and the source node of the first switching transistor, a sixth capacitor connected between the drain node of the first switching transistor and a supply voltage node, and a second inductor connected in parallel with the sixth capacitor; and a second phase noise reduction circuit including a seventh capacitor connected between a drain node of the second switching transistor and the source node of the second switching transistor, an eighth capacitor connected between the drain node of the second switching transistor and the supply voltage node, and a third inductor connected in parallel with the eighth capacitor.

9. The oscillator of claim 8, wherein the variable capacitor changes a conductance, wherein a capacitance of the variable capacitor is varied based on an adjustable voltage applied to a one end of the variable capacitor, and wherein a frequency of the differential output signals changes based on a variation of the capacitance of the variable capacitor.

* * * * *